United States Patent [19]

Lambert et al.

[11] Patent Number: 4,590,138

[45] Date of Patent: May 20, 1986

[54] POSITIVE-WORKING PHOTORESIST COMPOSITION AND METHOD FOR FORMING A LIGHT-ABSORBING MATRIX IN A COLOR CRT STRUCTURE

[75] Inventors: Robert L. Lambert, Seneca Falls; Judy A. Nagel, Romulus; Robert L. Bergamo, Seneca Falls, all of N.Y.

[73] Assignee: North American Philips Consumer Electronic Corp., New York, N.Y.

[21] Appl. No.: 729,453

[22] Filed: May 1, 1985

Related U.S. Application Data

[60] Division of Ser. No. 548,747, Nov. 4, 1983, Pat. No. 4,546,064, which is a continuation of Ser. No. 364,949, Apr. 2, 1982, abandoned.

[51] Int. Cl.$^4$ .............................................. G03C 5/00
[52] U.S. Cl. ........................................ 430/25; 430/23; 430/28; 430/327; 430/330; 430/540
[58] Field of Search ...................... 430/23, 25, 28, 327, 430/330, 540, 29; 354/1

[56] References Cited

U.S. PATENT DOCUMENTS

| | | | |
|---|---|---|---|
| 3,615,462 | 10/1971 | Szegho et al. | 430/330 X |
| 3,620,735 | 11/1971 | Ulano | 430/270 |
| 3,726,678 | 4/1973 | Robinder | 430/330 X |
| 3,804,621 | 4/1974 | McIntosh | 430/325 |
| 4,245,019 | 1/1981 | Bergamo et al. | 430/24 |
| 4,339,528 | 7/1982 | Goldman | 430/323 |
| 4,505,999 | 3/1985 | Bergamo et al. | 430/24 |

*Primary Examiner*—John E. Kittle
*Assistant Examiner*—José G. Dees
*Attorney, Agent, or Firm*—Norman N. Spain

[57] ABSTRACT

A positive-working photoresist composition is described comprising a solution of polyvinyl alcohol, an inorganic ferric salt, ammonium trioxalatoferrate and a diol such as 1,4-butanediol. There is also described the addition of a finely divided black pigment to such a composition and the use of such a black pigmented composition for the formation of a light-absorbing matrix in a color CRT screen structure.

4 Claims, No Drawings

POSITIVE-WORKING PHOTORESIST COMPOSITION AND METHOD FOR FORMING A LIGHT-ABSORBING MATRIX IN A COLOR CRT STRUCTURE

This is a division of application Ser. No. 548,747, filed Nov. 4, 1983, now U.S. Pat. No. 4,546,064, said application Ser. No. 548,747 in turn being a continuation of application Ser. No. 364,949, filed Apr. 1, 1982 and now abandoned.

BACKGROUND OF THE INVENTION

This invention relates to a positive-working resist composition, a pigmented formulation of a positive-working resist composition and to a method for using this pigmented formulation for forming a light-absorbing matrix in color cathode ray tube screens.

Color cathode ray tubes (CRT) such as employed in color television applications generally have a patterned screen comprising repetitive groups of phosphor material which may be in the form of bars, stripes or dots. Thus, the well known shadow mask tube construction may be employed wherein the screen pattern is in the form of dots formed of selected cathodo luminescent phosphors which phosphoresce by predetermined electron excitation, to produce additive primary hues in order to produce the desired color emanations.

This electron excitation of the phosphor dots is achieved by focusing the electron beams from three electron guns through a shadow mask positioned in a spaced manner from the screen. The shadow mask is provided with apertures each of which is perceptively related to a specific grouping of similar shaped dots in the screen structure to enable selected electron beams traversing the apertures to impinge on the proper phosphor dots on the screen. These dots are generally separated by relatively small interstitial spacings in order to enhance color purity by reducing the possibility of electronic excitation of adjacent dots.

In order to enhance the brightness, color purity and contrast of the resulting color screen image the interstitial spacing between the phosphor dots, stripes or bars is generally occupied by an opaque light-absorbing material or a matrix which generally is a black pigmented material.

Hedler et al, U.S. Pat. No. 3,658,530 describes a frequently employed method for providing such a light-absorbing matrix on a screen of a color CRT.

According to the method described in this patent the interior surface of the screen is coated with a thin uniform layer of a polyvinyl alcohol solution made photosensitively active with an hexavalent chromate material. The thus coated screen is then exposed to light through the apertures of a pattern mask thereby polymerizing the exposed portions of the photosensitive polyvinyl alcohol layer. The exposed coating is then soaked with water to remove the unexposed and resultant unpolymerized areas of the polyvinyl alcohol layer to thereby provide a plurality of repetitive elements of polymerized polyvinyl alcohol dots separated by an interstitial pattern or web of substantially clear glass.

This panel is then coated with an opaque colloidal suspension of graphite and then dried to form an opaque graphite film, the opaque graphite film being present both on the bare glass and on the polymerized polyvinyl alcohol dots.

The panel is then treated with a hydrazo-reducing agent capable of degrading the polymerized polyvinyl alcohol dots. By this treatment the light polymerized polyvinyl alcohol pattern dots are degraded and the graphite film positioned on these dots is loosened from the screen.

The screen is then rinsed to remove the loosened degraded polyvinyl alcohol dots and the associated graphite and leaving thereby a multitude of clear glass windows surrounded by an opaque interstitial web or matrix of graphite.

The resulting window patterned screen is then dried and by means of conventional screening techniques the phosphors are applied to the respective window areas and a cathode luminescent screen is formed.

This method has the drawbacks in that the large number of steps in the process which requires manual handling provides opportunities for potential handling errors and inclusion of dirt in the screen.

Further the use of the hexavalent chromium provides a potential pollution problem as the amounts of this material and the hydrazo-reducing agents materials permitted in the effluent are extemely small.

Similar methods of forming the light absorbing opaque matrix are disclosed in Speigel, U.S. Pat. No. 3,822,454, particularly column 9, lines 20–60; and Bergamo et al U.S. Pat. No. 4,245,019, particularly column 4, line 37 - column 5, line 60 where a hydrogen peroxide solution is employed as the degrading agent.

While the use of hydrogen peroxide is advantageous over the hydrazide degrading solutions of the Hedler et al patent as being less hazardous, the use of hydrogen peroxide solutions are still undesirable as the hydrogen peroxide solutions are also hazardous and they must be closely controlled both for safety's sake and for proper image development. In addition, the presence of undecomposed hydrogen peroxide in the manufacturing plant effluent will reoxidize any trivalent chromium (produced by a previous light exosure process) to hexavalent chromium compounds.

OBJECTS AND SUMMARY OF THE INVENTION

An object of this invention is to provide photoresist compositions which eliminate or reduce the use of hexavalent chromates and other potentially hazardous reagents.

Another object of this invention is to provide an improved composition for use in forming a light-absorbent opaque matrix in the production of color cathode ray tubes.

Still another object of this invention is to provide a method of forming a light-absorbing opaque matrix on the screens of color cathode ray tubes in which there is a substantial reduction of steps.

These and other objects of the invention will be apparent from the description that follows.

According to one aspect of the invention some of these objects are achieved by a new and novel positive-working photoresist composition which composition contains no hexavalent chromium or other hazardous material but instead comprises a mixture in water of either ammoniumtrioxalatoferrate or ferric ammonium tricitrate, polyvinyl acetate 85 to 99% hydrolyzed to polyvinyl alcohol, an inorganic ferric salt such as ferric nitrate or ferric sulfate, and a diol such as 1,4-butanediol, 1,5-pentanediol and 1,4-pentanediol.

Unlike the hexavalent chromium activated polyvinyl alcohol compositions the instant composition is a positive-working resist composition.

The photosensitive composition of the invention is employed to form a positive photoresist in the following manner. A thin layer of the composition is applied to a substrate. The thin layer is then dried at room temperature in order to remove a sufficient amount of water to cause the layer to become immobile. The thin layer is then exposed to radiation within the range of 302 nm to approximately 488 nm in a desired pattern to cause the exposed areas to become water soluble. The layer thus selectively exposed is then heated at about 95° F. to 120° F. to remove the remainder of the water and to cause the unexposed areas of the layer to become water insoluble. Finally, the exposed portions of the layer are removed by developing the layer with water.

While not being bound to the following explanation it is believed that the mechanism by which this photosensitive composition functions is as follows: If the composition is thoroughly dry the $Fe^{+++}$ of the ferric nitrate dissolved only its water of crystallization will react with the hydroxyl groups of the polyvinyl alcohol to form a complex which becomes insoluble through crosslinking of these molecule chains through oxygen-iron-oxygen bridges. These bridges may be broken and the complex rendered soluble by exposure to dilute organic acids such as acetic, citric or oxalic acids.

However, when a stabilized acid salt such as a ferric ammonium oxalate or a ferric ammonium citrate is employed it releases the acid at a sufficiently slow rate to make practical use for it in a photosensitive composition. the usefulness of these ammonium ferric salts in photosensitive compositions is based on the ability of these salts to react only very slowly to resolubilize the ferric ion polyvinyl alcohol complex under normal conditions but, when exposed to a UV light source such as a mercury lamp, to decompose rapidly to suply free acid and thus very rapidly solubilize the ferric ion polyvinyl alcohol complex.

While both the ferric ammonium tricitrate and the ammonium trioxalatoferate may be employed, the ammonium trioxalatoferrate is preferred because it has greater solubility.

Preferably the diol that is employed is 1,4-butanediol and the inorganic ferric salt preferably employed is ferric nitrate.

The solid content of these compositions is in general from 3-7% by weight.

A particularly desirable composition contains per hundred grams of polyvinyl acetate 88% hydrolyzed to polyvinyl alcohol about 80 to 200 grams of 1,4-butanediol, about 35 to 125 grams of ammonium trioxalatoferrate, about 30 to 100 grams of ferric nitrate and about 1,000 to 5,000 milliliters of water.

The positive-working photoresist compositions of this aspect of the invention are particularly useful in the production of color CRT screen structures, for example the black light-absorbing matrix, by a method which may involve depositing a layer of such a photoresist composition on the inner surface of a viewing panel of a glass CRT envelope, exposing the photoresist layer through a shadow mask, depositing on the exposed photoresist layer an opaque graphite layer from an aqueous graphite dispersion and then developing the superimposed layers with water to remove the graphite layer associated with the exposed layers of the photoresist layer from the viewing panel.

However these compositions may be used for other purposes, for example in the production of printed circuits, for photoetching and for many other purposes.

Other objects of the invention are considered to be met by another aspect of the invention wherein there is provided a pigmented positive-working photoresist composition that is particularly adapted for the production of a black, light-absorbing matrix on a color CRT screen and by a novel method of employing this pigmented composition for the production of such a black light-absorbing matrix.

This novel composition comprises the previously described positive-working photoresist composition of the invention pigmented with a finely divided black pigment.

This black pigmented positive-working photoresist composition of the invention is particularly adapted for the formation of a black light-absorbing matrix in a color picture tube screen as it presents the advantages in not only eliminating the use of the hazardous ammonium hexachromate and hydrogen peroxide or hydrazide solutions but also provides the advantages of allowing elimination of some of the steps previously required for formation of the light-absorbing matrix.

As the black pigment there is generally employed finely divided graphite or lampblack, the graphite employed generally having an average particle size of 0.8–1.3 u and the lampblack an average particle size of about 70–100 mu.

Preferably the solid content of the pigmented composition is about 3%–7% by weight.

Particularly useful pigmented compositions are those comprising a 3% to 7% volume mixture in water of about 1 mole of approximately polyvinyl acetate 88% hydrolyzed to polyvinyl alcohol, about 0.5–1.5 moles of 1,4-butanediol, about 0.5–1.5 moles of ammonium trioxalatoferrate, about 0.05–0.07 mole of ferric nitrate and about 3–12 moles of moles of finely divided graphite or lamp-black.

It is preferred that the polyinyl alcohol have a molecular weight within the range of about 40,000–175,000.

According to another aspect of the invention the pigmented photoresist composition of the invention may be employed to form a black, light-absorbing matrix for separating light luminescing areas on a color CRT screen in the following manner. A thin aqueous layer of the pigmented photoresist composition is provided on the inner surface of the viewing panel of a CRT envelope. This aqueous layer is dried at room temperature for about 15 to 180 seconds in order to remove some of the water and cause the thin layer to become immobile. Thereafter this layer is exposed to ultraviolet radiation beamed through multiple openings of a pattern mask located in a position spaced from the layer in order to cause these areas designated for coating by phosphors to become water soluble. Most frequently the layer is sequentially exposed three times; the position of the light source for each exposure positioned to substantially correspond to that of the subsequently placed electron gun used to excite the desired color pattern in the finished tube. The exposed layer is then heated at 95°–1200° F. for about 1 to 3 minutes to remove the remainder of the water and cause the unexposed areas of the layer to become water insoluble. The exposed portions of the layer are then removed by development with water.

As a result the surface of the viewing panel is provided with a black light-absorbing matrix surrounding areas of the surface suitable for formation into light luminescing areas by providing these areas with cathodo luminescent phosphors by means well known in the art.

DESCRIPTION OF THE PREFERRED EMBODIMENTS

The invention will now be described in greater detail with reference to the following examples:

I. NON-PIGMENTED PHOTORESIST COMPOSITION

A non-pigmented photoresist component was prepared by mixing the following ingredients.

Polyvinyl alcohol 523 (5.65% aqueous solution of polyvinyl-acetate 88% hydrolyzed to; polyvinyl alcohol of molecular weight of 40,000–175,000): 3000 ml
1,4-butanediol: 150 ml
deionized water: 7940 ml
0.1 molar ammonium trioxalatoferrate: 2310 ml
0.1 molar ferric nitrate ($Fe(NO_3)_3 \cdot 9H_2O$): 1500 ml The resultant composition was deposited on a surface of a glass panel to produce a layer with a thickness of about 10 u.

The coated panel was then spun at room temperature for about 1-2 minutes to remove a sufficient amount of the water to cause the layer to become immobile.

The layer was then exposed for about 45 seconds, to ultraviolet radiation of 365 nm from a 100 watt light source through a shadow mask having apertures of about 6-10 mils.

The exposed layer was then dried at 100° F. for about 1 minute. the resultant dried layer with a thickness of about 0.5-1.0 u was then developed by washing with water.

As a result, a pattern of clear transparent windows surrounded by a 0.7 u thick network of hard, water-insoluble, polymerized polyvinyl alcohol was formed on the panel, each window having a diameter of about 6-10 mils and corresponding to an aperture of the shadow mask.

II. PIGMENTED PHOTORESIST COMPOSITION

A black pigmented photoresist composition was prepared by mixing the following ingredients.

Polyvinyl Alcohol 523:200 ml
0.7M Ammonium Trioxalatoferrate: 66 ml
0.35M Ferric Nitrate $Fe(NO_3)_3 \cdot 9H_2O$: 86 ml
10% 1,4-butanediol: 260 ml
Graphite Dispersion:
(12% solids—average particle size 0.8–1.3 u): 180 ml The resultant composition was deposited on the inner surface of the glass face panel of a cathode ray tube envelope.

The envelope was then spun at room temperature for about 3 minutes to remove a sufficient amount of water to cause the deposited layer to become immobile.

A shadow mask, similar to that previously employed, was affixed to the viewing panel in a position spaced from the deposited layer on the inner surface thereof. The layer was then exposed, through the mask, to a light source similar to that previously employed, for a period of about 1 minute.

The position of the light source substantially corresponded with that of a subsequently placed electron gun employed to excite one of the primary color luminescing phosphor layers employed in the finished tube.

The light source was moved to two other positions corresponding with the positions coresponding with the two other subsequently placed electron guns used to excite the other two primary color luminescing phosphor layers employed in the finished tube. Exposure of the layer from these two additional positions was carried out in an identical manner.

The exposed layer was then dried at about 100° F. for about 3 minutes. The resultant hardened black opaque layer of about 1-1.5 u thickness was thus developed by washing with water at room temperature.

As a result, the exposed portions of the layer were removed, leaving a black light-absorbing matrix surrounding clear window areas, each window area corresponding essentially to an aperture of shadow mask and being suitable for coating by primary light cathode luminescing phosphors by means well known in the art.

It will be apparent that various modifications may be made to the present invention without departing from its scope as defined in the following claims.

We claim:

1. A method of providing a color cathode ray tube screen including a viewing panel and discrete color luminescing areas responsive to electron excitation positioned on the inner surface of said viewing panel with a black, light-absorbing matrix separating said color luminescing areas, said method comprising the steps of:
   (a) providing on a surface of the inner surface of the viewing panel of a glass cathode ray tube envelope a thin aqueous layer of 3–7% by volume mixture in water of about 1 mole of approximately polyvinyl acetate 88% hydrolyzed to; polyvinyl alcohol, about 0.5–1.5 moles of 1,4-butanediol, about 0.5–1.5 moles of ammonium trioxalatoferrate, about 0.05–0.07 mole of ferric nitrate and about 3–12 moles of finely divided graphite or lampblack;
   (b) drying said thin aqueous layer at room temperature for about 15–180 seconds to cause said thin layer to become immobile;
   (c) exposing areas of said thin layer corresponding to said color luminescing areas to ultra-violet radiation for a time sufficient to cause said exposed areas to become water soluble.
   (d) heating said thin layer at a temperature of about 95°–120° F. for about 1–3 minutes to thereby remove the remainder of water from said thin layer matrix and render water-insoluble the unexposed areas of said layer;
   (e) removing the exposed portions of said layer from said surface by developing said layer with water, thereby providing said surface with a black, light absorbing, matrix surrounding areas of said surface suitable for coating by phosphors for forming said color luminescing areas.

2. The method of claim 1 wherein the polyvinyl alcohol is polyvinyl acetate 88% hydrolyzed to polyvinyl alcohol of a molecular weight of 40,000–175,000.

3. The method of claim 2 wherein finely divided graphite of an average particle size of 0.8–1.3 u is employed.

4. The method of claim 2 wherein lampblack of an average particle size of 70–100 mu is employed.

* * * * *

UNITED STATES PATENT AND TRADEMARK OFFICE
CERTIFICATE OF CORRECTION

PATENT NO. : 4,590,138

DATED : May 20, 1986

INVENTOR(S) : ROBERT L. LAMBERT ET AL

It is certified that error appears in the above-identified patent and that said Letters Patent is hereby corrected as shown below:

In the Claims:

Column 6, line 34, "to;" should be --to--.

Signed and Sealed this

Twenty-third Day of September 1986

[SEAL]

Attest:

DONALD J. QUIGG

*Attesting Officer*     *Commissioner of Patents and Trademarks*